(12) United States Patent
Naylor et al.

(10) Patent No.: US 12,525,488 B2
(45) Date of Patent: Jan. 13, 2026

(54) INTERCONNECT LINE STRUCTURES WITH METAL CHALCOGENIDE CAP MATERIALS

(71) Applicant: Intel Corporation, Santa Clara, CA (US)

(72) Inventors: Carl H. Naylor, Portland, OR (US); Christopher Jezewski, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 875 days.

(21) Appl. No.: 17/560,089

(22) Filed: Dec. 22, 2021

(65) Prior Publication Data

US 2023/0197512 A1 Jun. 22, 2023

(51) Int. Cl.
*H01L 21/768* (2006.01)
*H01L 23/522* (2006.01)
(Continued)

(52) U.S. Cl.
CPC .. *H01L 21/76886* (2013.01); *H01L 21/76834* (2013.01); *H01L 23/5226* (2013.01); *H01L 23/5283* (2013.01); *H01L 23/53238* (2013.01); *H01L 21/02474* (2013.01); *H01L 21/02477* (2013.01); *H01L 21/02516* (2013.01)

(58) Field of Classification Search
CPC ......... H01L 21/76886; H01L 21/76834; H01L 23/5226; H01L 23/5283; H01L 23/53238; H01L 21/02474; H01L 21/02477; H01L 21/02516; H01L 21/76807; H01L 21/76849; H01L 23/49866; H01L 21/76802; H01L 21/76831; H01L 21/76879; H01L 21/76883; H01L 23/481; H01L 23/49811; H01L 23/49827; H01L 23/49838; H01L 23/5384; H01L 23/5386; C23C 8/08; C23C 8/28; C23C 8/80; C23C 14/5806; C23C 14/5866; C23C 16/56; C25D 5/48; C25D 5/50; C25D 7/12

See application file for complete search history.

(56) References Cited

U.S. PATENT DOCUMENTS 8,021,486 B1 9/2011 Yu et al.
2005/0127479 A1* 6/2005 Cohen et al. ..... H01L 21/76849
257/627

(Continued)

OTHER PUBLICATIONS

Extended European Search Report from European Patent Application No. 22205269.8 notified May 22, 2023, 7 pgs.

*Primary Examiner* — Christine S. Kim
*Assistant Examiner* — Nathalie R Fayette
(74) *Attorney, Agent, or Firm* — Essential Patents Group, LLP

(57) ABSTRACT

Integrated circuit interconnect structures including an interconnect line metallization feature subjected to one or more chalcogenation techniques to form a cap may reduce line resistance. A top portion of a bulk line material may be advantageously crystallized into a metal chalcogenide cap with exceptionally large crystal structure. Accordingly, chalcogenation of a top portion of a bulk material can lower scattering resistance of an interconnect line relative to alternatives where the bulk material is capped with an alternative material, such as an amorphous dielectric or a fine grained metallic or graphitic material.

12 Claims, 12 Drawing Sheets

(51) Int. Cl.
  *H01L 23/528* (2006.01)
  *H01L 23/532* (2006.01)
  *H01L 21/02* (2006.01)

(56) References Cited

U.S. PATENT DOCUMENTS

| | | | |
|---|---|---|---|
| 2017/0033003 A1* | 2/2017 | Song et al. | H01L 23/53238 |
| 2018/0033727 A1* | 2/2018 | Lee et al. | H01L 21/76849 |
| 2018/0097473 A1* | 4/2018 | Antunez et al. | H02S 40/38 |
| 2020/0388685 A1* | 12/2020 | Sharma et al. | H10D 62/83 |
| 2021/0111129 A1* | 4/2021 | Naylor et al. | H01L 21/76856 |

* cited by examiner

INTERCONNECT LINE STRUCTURES WITH METAL CHALCOGENIDE CAP MATERIALS

BACKGROUND

Demand for higher performance integrated circuits (ICs) in electronic device applications has motivated increasingly dense transistor architectures. Interconnect parasitics become a greater challenge as the density of interconnect metallization structures keeps pace with transistor density. For example, the resistance-capacitance (RC) delay product associated with interconnects of an IC increases with the density of the interconnects.

FIG. 1A illustrates a conventional interconnect structure that includes a metal line 101 within a first interconnect level. A transverse width of metal line 101 has some lateral critical dimension CD1. A dielectric material 102 is over metal line 101, and a "via" 103 is subtractively patterned a via depth $D_V$ through dielectric material 102 in the z-dimension to expose a portion of metal line 101.

As further illustrated in FIG. 1A and FIG. 1B, via 103 and a trench 106 of CD3 is filled with one or more metals to form an interconnect line 108 that extends in the x-y dimension to intersect conductive material in via 103 so that two interconnect levels are electrically connected. In this example, liner material 105 is on a bottom and a sidewall of trench 106 and/or interconnect line 108. Liner material 105 may include a barrier material to prevent diffusion/migration of a bulk material 107 out of the interconnect structure, as any loss of bulk material 107 can be catastrophic to an integrated circuit. Liner material may also include an adhesion material instead of a barrier material, or in addition to a barrier material. An adhesion material is to improve adhesion of a bulk material 107 that would otherwise suffer poor adhesion with an underlying material, such as a barrier material, and/or dielectric material 102.

Although not illustrated in FIG. 1B, a dielectric material, such as $SiON_x$, is often deposited over interconnect line 108 to complete encapsulation of bulk material 107 and thereby minimize diffusion/migration. Interconnect line architectures, and techniques for forming such line architectures, that can reduce the electrical resistance of interconnect line 108 are commercially advantageous at least for their associated reduction in RC delay.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1A:
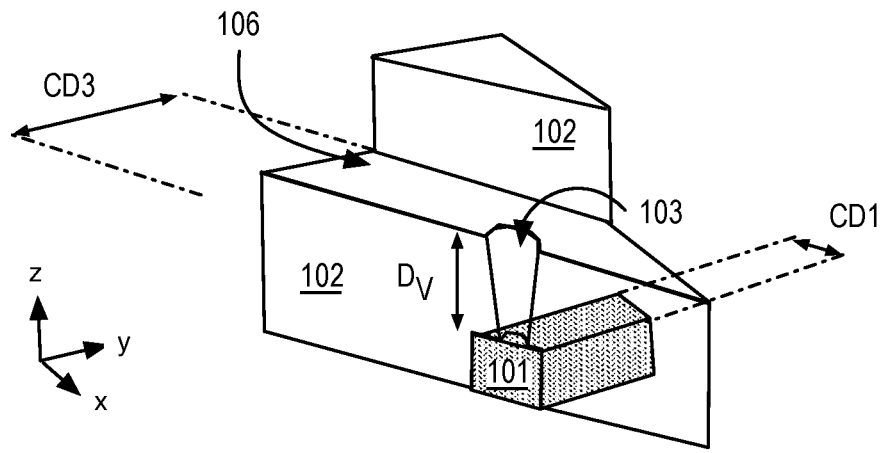
FIGS. 1A and 1B illustrate isometric cross-sectional views of an IC interconnect structure, in accordance with convention.
Figure 1B:
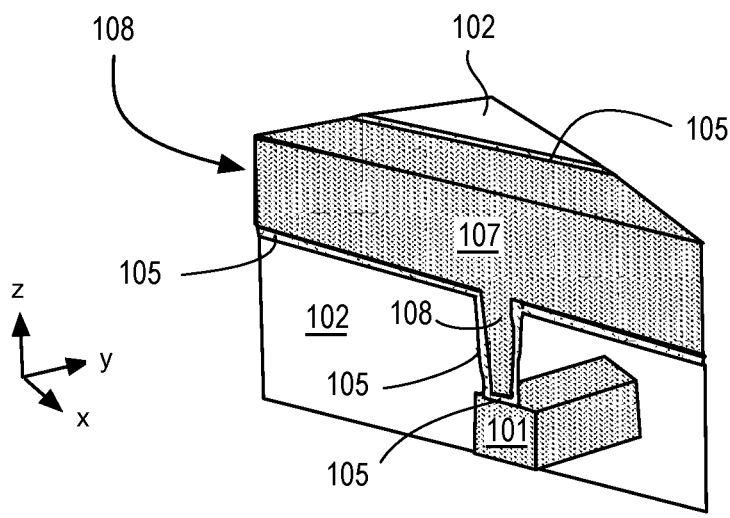

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The term "adjacent" here generally refers to a position of a thing being next to (e.g., immediately next to or close to with one or more things between them) or adjoining another thing (e.g., abutting it).

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. These terms are not intended as synonyms for each other. Rather, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

The term "signal" may refer to at least one current signal, voltage signal, magnetic signal, or data/clock signal.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

As used throughout this description, and in the claims, a list of items joined by the term "at least one of" or "one or more of" can mean any combination of the listed terms.

Unless otherwise specified in the explicit context of their use, the terms "substantially equal," "about equal" or "approximately equal" mean that there is no more than incidental variation between two things so described. In the art, such variation is typically no more than +/−10% of a predetermined target value.

As described below, one or more chalcogenation techniques may be integrated into a damascene interconnect process to cap an interconnect line in a manner that can reduce electrical resistance of the interconnect line. The inventors have found chalcogenation of a top portion of a bulk material in the interconnect line can lower scattering resistance of the line relative to alternatives where the bulk material is capped with an alternative material, such as an amorphous dielectric or a fine grained metallic or graphitic material. As described further below, chalcogenation of a top portion of a bulk material may advantageously crystallize the top line portion into a metal chalcogenide cap having exceptionally large crystal structure offering a significant reduction in integrated circuit interconnect line resistance. As also described below, chalcogenation of a top portion of a bulk like metal in accordance with embodiments herein may incur a negligible interconnect line volume penalty because a top portion of the bulk material is converted to a metal chalcogenide cap as opposed to a discrete cap material being layered upon the bulk line metal.

Figure 2:
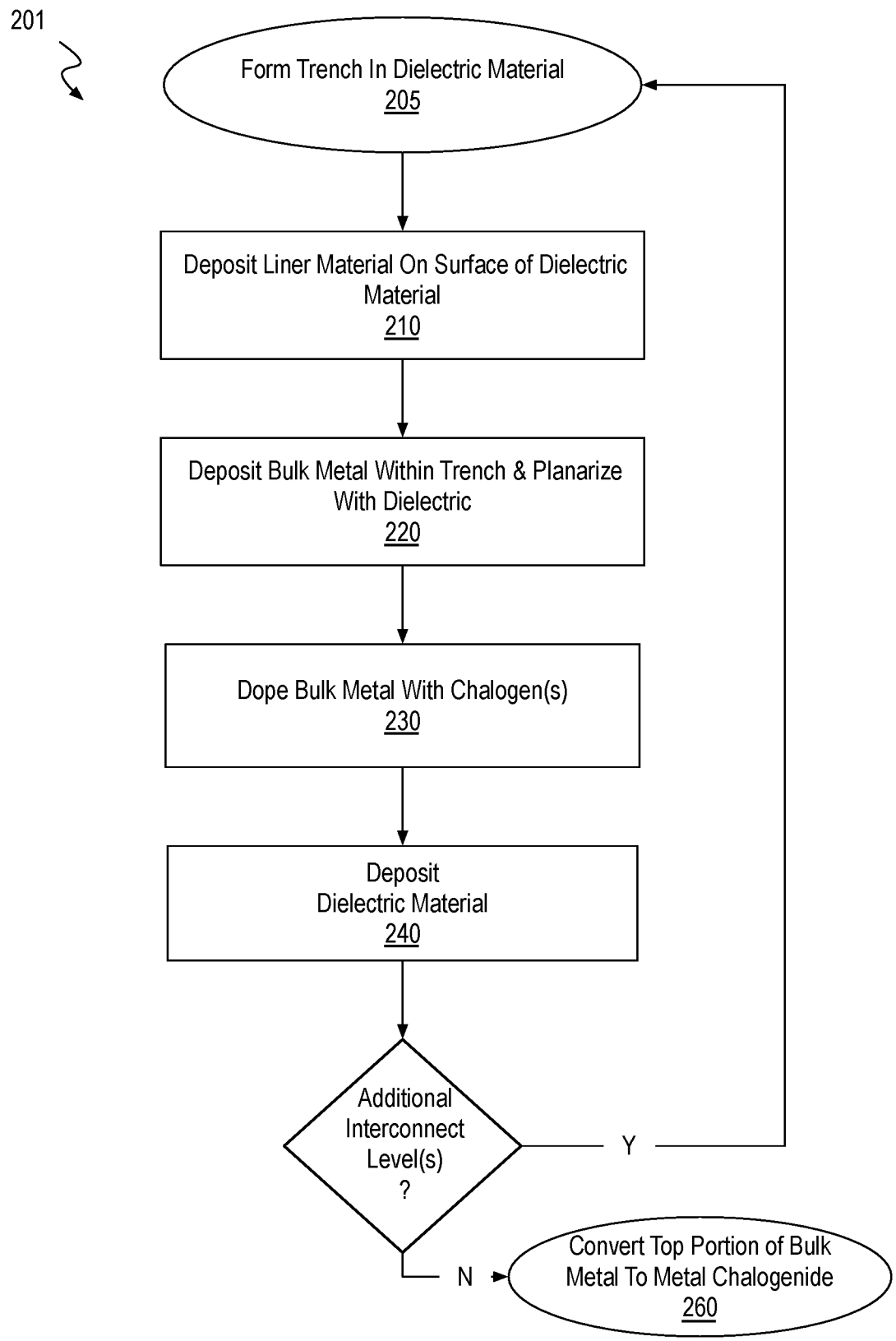
FIG. 2 is a flow chart of methods of fabricating one level of an integrated circuit interconnect structure having a low resistance line comprising a metal chalcogenide cap, in accordance with some embodiments.

FIG. 2 is a flow chart of methods 201 for fabricating one level of an integrated circuit interconnect structure having a low resistance line, in accordance with some embodiments. Methods 201 may be practiced on a workpiece, such as a large format (e.g., 300-450 mm) semiconductor wafer. The wafer may include a Group IV semiconductor material layer (e.g., Si, Ge, SiGe, GeSn, etc.), a Group III-V semiconductor material layer, or a Group II-VI semiconductor material layer, for example. The workpiece may include one or more underlying device layers including a semiconductor material layer, and may also have one or more interconnect levels interconnecting devices (e.g., transistors) of the devices layers.

Methods 201 begin at operation 205 where at least a trench is subtractively patterned into one or more dielectric materials of an IC interconnect structure. The trench may be any "dual-damascene" type structure that further includes a via opening in the dielectric materials, or any "single-damascene" type structure that exposes an underlying conductive via previously fabricated in the workpiece. The trench may be patterned into any dielectric material(s) suitable as an IC interlayer dielectric material (ILD). In some exemplary embodiments, the trench is formed in a low-k dielectric material, for example having a relative permittivity less than about 3.4. The trench may also be formed in a conventional dielectric material having a somewhat higher relative permittivity in the range of 3.5-9. The trench may also be formed in a high-k dielectric material having an even higher relative permittivity, for example exceeding 9.5. In some specific examples, the trench is formed in one of SiOC(H), hydrogen silsesquioxane, methyl silsesquioxane, polyimide, polynorbornene, benzocyclobutene $SiN_x$, $SiO_2$, $SiO_xN_y$, $HfO_2$, $ZrO$, or $Al_2O_3$.

In dual-damascene embodiments, both a trench and a via opening are patterned into the dielectric material at operation 205. In single-damascene embodiments, only a trench is patterned at operation 205. The trench patterned at operation 205 exposes some underlying interconnect metallization feature, such as a conductive via or a conductive interconnect line. For example, in a dual-damascene interconnect fabrication process, a via, but not the trench, exposes some region of an underlying metallization line or via of a lower-level interconnect structure. In a single-damascene interconnect fabrication process, the trench formed at operation 205, exposes some region of an underlying metal-filled conductive via of a lower-level interconnect structure.

Methods 201 continue at operation 210, wherein one or more liner material layers are deposited upon dielectric surfaces of the trench. Any deposition process known to be suitable for depositing a particular liner material into a trench may be practiced at operation 210 as embodiments herein are not limited in this respect. The liner material layer(s) may be deposited non-selectively, in which case the liner material layer(s) also accumulates on surfaces of any metallization exposed within the trench. The liner material layer(s) may also be deposited selectively, for example on the dielectric surfaces in preference over "non-growth" surfaces of a metallization exposed within the trench. The liner material layer(s) may be deposited to any thickness functional as a barrier layer and/or adhesion layer.

Methods 201 continue at operation 220 where one or more bulk line metals are deposited in contact with an uppermost one of the liner materials layer(s). Any deposition process known to be suitable for depositing a particular bulk material into a trench and/or via opening may be practiced at operation 220 as embodiments herein are not limited in this respect. In some examples, an electrolytic plating process is practiced at operation 220 to deposit a bulk material. In further embodiments, multiple deposition processes may be practiced at operation 220. For example, an electrolytic plating process may be preceded by physical vapor deposition (PVD) of a seed layer. Deposition of the bulk materials may also comprise PVD, chemical vapor deposition (CVD), atomic layer deposition (ALD), or electroless plating. For example, a wetting material layer may be deposited by PVD, CVD, ALD or electroless plating prior to an electrolytic plating of a bulk material comprising predominantly copper (Cu). Although the deposition of Cu is one exemplary embodiment, other metals may be deposited at operation 220. For example, one or more of Mo, W, Ru, Re, Co, Ir, Rh, Pt, Pd or Al may be deposited in the alternative to Cu, or in conjunction with Cu.

Operation 220 is completed with a planarization of at least the bulk material and the liner material (layers) to expose a top surface of the dielectric material surrounding the trench. The planarization process may remove any bulk material and liner material from the dielectric material in regions beyond a perimeter of an interconnect line structure. Any planarization (e.g., CMP) process may be practiced to complete the metallization of an interconnect feature.

Methods 201 continue at operation 230 where a top portion of the bulk material following planarization is a metal M is doped with a chalcogen C (i.e., a chalcogen-doped metal M:C). In some examples, operation 230 comprises heating the workpiece to over 100° C. (e.g., 125° C., 150° C., 200° C., or 250° C.) while exposing the top surface of the bulk line metal to a chalcogenide precursor gas. Within the bulk material, the chalcogen dopant concentration may therefore be highest proximal to the surface and decline with distance from the surface.

As used herein, chalcogens include sulfur, selenium or tellurium (oxygen is excluded). The precursor gas may have various compositions, with some examples including $H_2S$, $H_2Se$, $H_2Te$. These gaseous precursor compounds may readily degrade to their respective elements at the elevated temperature of the heated substrate. These exemplary precursor gases can also act as strong reducing agents, so they may be combined or replaced with weaker reducing agents/stronger oxidizing agents. Gases including oxygen, for example, temper the reducing strength more than those that lack oxygen. In some embodiments, $SO_2$ or $SeO_2$ may be introduced in combination with, or to the exclusion of, $H_2S$ or $H_2Se$, for example. Other gases, such as, $NH_3$, $N_2$, Ar, $N_2O$, or $S_xO_y$, $Se_xO_y$, $Te_xO_y$ with x or y being 1, 2 (e.g., $SO_2$, $SeO_2$) or 3, or $SF_z$, $Se_z$ or $Te_z$ with z either 4 or 6 (e.g., $SF_6$, $TeF_6$) may also be introduced in combination with one or more of $H_2S$ and, $H_2Se$ and or $H_2Te$. For the duration of operation 230 the chalcogen(s) diffuse into the bulk material, doping the bulk material to some peak concentration within a certain distance from the top surface of the bulk material.

Methods 201 continue at operation 240 where one or more dielectric materials are deposited over the chalcogen doped interconnect line. In some embodiments, the dielectric material deposited at operation 240 is suitable as a diffusion barrier. For example, the dielectric material deposited at operation 240 may comprise silicon and nitrogen (e.g., $SiN_x$ or $SiO_xN_y$). However, the dielectric material deposited at operation 240 may also be any material known to be suitable as an interlayer dielectric (ILD) material in reliance of the chalcogen dopant ultimately forming a cap material having an adequate diffusion barrier in addition to reducing scattering resistance of the bulk material.

Methods 201 may be repeated for any number of successive interconnect levels. If no more interconnect levels are to be fabricated, methods 201 complete with a transient thermal process at operation 260 that converts a top portion of the bulk line metal into a metal chalcogenide (e.g., $MC_x$). Operation 260 may be a furnace anneal, a flash anneal, or laser anneal, for example. A furnace anneal (or other anneal) may be performed in a forming gas or other ambient at a predetermined temperature and duration sufficient to react the bulk material within regions having a sufficiently high concentration of chalcogen doping into the metal chalcogenide. Where chalcogen doping is insufficient to form the metal chalcogenide, the chalcogen dopant may migrate toward the metal chalcogenide, feeding the conversion, or may migrate toward interfaces of the bulk material and the liner material and/or to surrounding dielectric material interface(s). In some embodiments, the anneal is performed at a temperature compatible with backend processing (e.g., <400° C.). In some embodiments, the anneal performed at operation 260 is at a higher temperature than the temperature at which the chalcogen dopant is introduced into the metallization at operation 230. For example, where a chalcogen dopant is introduced into a bulk material of predominantly Cu at a temperature less than 250° C., the anneal performed at operation 260 is at a temperature of 250-350° C.

In some examples where interconnect features are predominantly Cu, a cap comprising a Cu chalcogenide is formed within the top portion of the interconnect line. Exemplary Cu chalcogenides include $CuS_x$, $CuSe_x$, $CuSe_xS_y$, $CuTe_x$, or $CuSe_xTe_y$. Although the Cu chalcogenide may advantageously be a dichalcogenide (e.g., $Cu_2S$ such that x is 0.5), it may not be a dichalcogenide and x may vary. In other embodiments where an interconnect line comprises an alternative bulk material, (e.g., predominantly Mo, W, Ru, Re, Co, Ir, Rh, Pt, Pd, Al, etc.), the corresponding alternative metal chalcogenide (e.g., $MoS_x$, $WS_x$, $RuS_x$, $ReS_x$, $CoS_x$, $IrS_x$, $RhS_x$, $PtS_x$, $PdS_x$, $AlS_x$, etc.) may be similarly formed within a top portion of the bulk and may also be a metal dichalcogenide.

The thermal processing may therefore form a metal chalcogenide cap of different crystallinity than the bulk material. Hence, the microstructure of the metal chalcogenide cap will be distinct from that of the bulk material. The metal chalcogenide cap may be considered a 2D material as a result of its crystalline microstructure (i.e., long range atomic ordering) within a 2D plane of each monolayer that is substantially parallel to the plane of the IC interconnect line.

FIGS. 3A, 4A, 5A, and 6A illustrate a plan view of a portion of an IC interconnect structure portion 301 evolving as the methods 201 are practiced, in accordance with some dual-damascene embodiments. FIGS. 3B, 4B, 5B and 6B further illustrate a cross-sectional view of a portion of IC interconnect structure portion 301 evolving, in accordance with some dual-damascene embodiments.

Figure 3A:
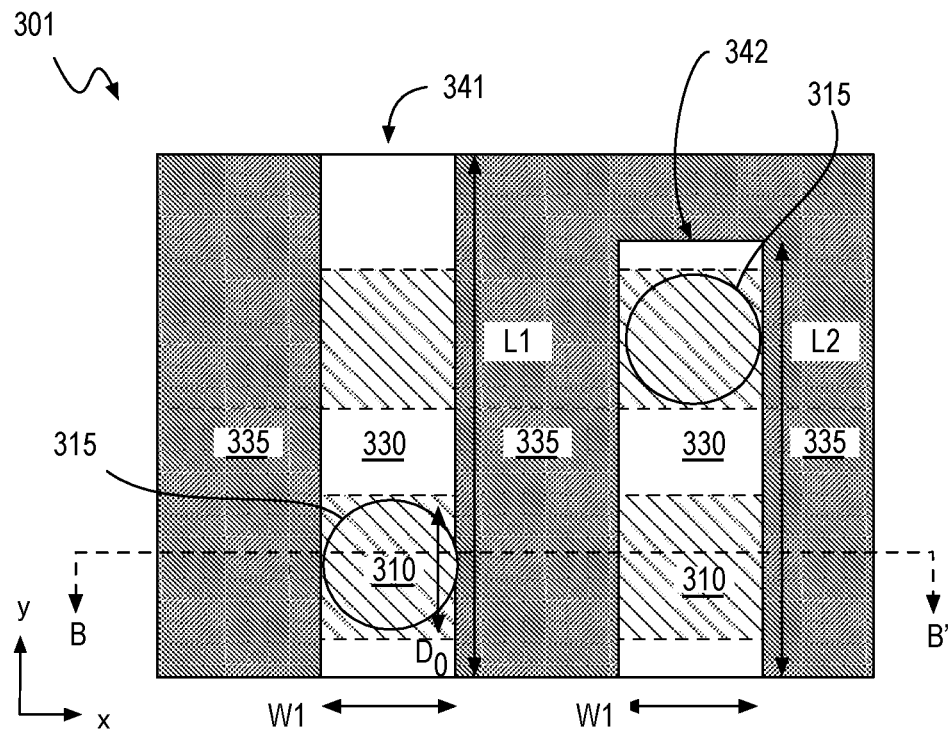
FIGS. 3A, 4A, 5A, and 6A illustrate a plan view of a portion of an IC interconnect structure evolving as the methods illustrated in FIG. 2 are practiced, in accordance with some dual-damascene embodiments.
Figure 3B:
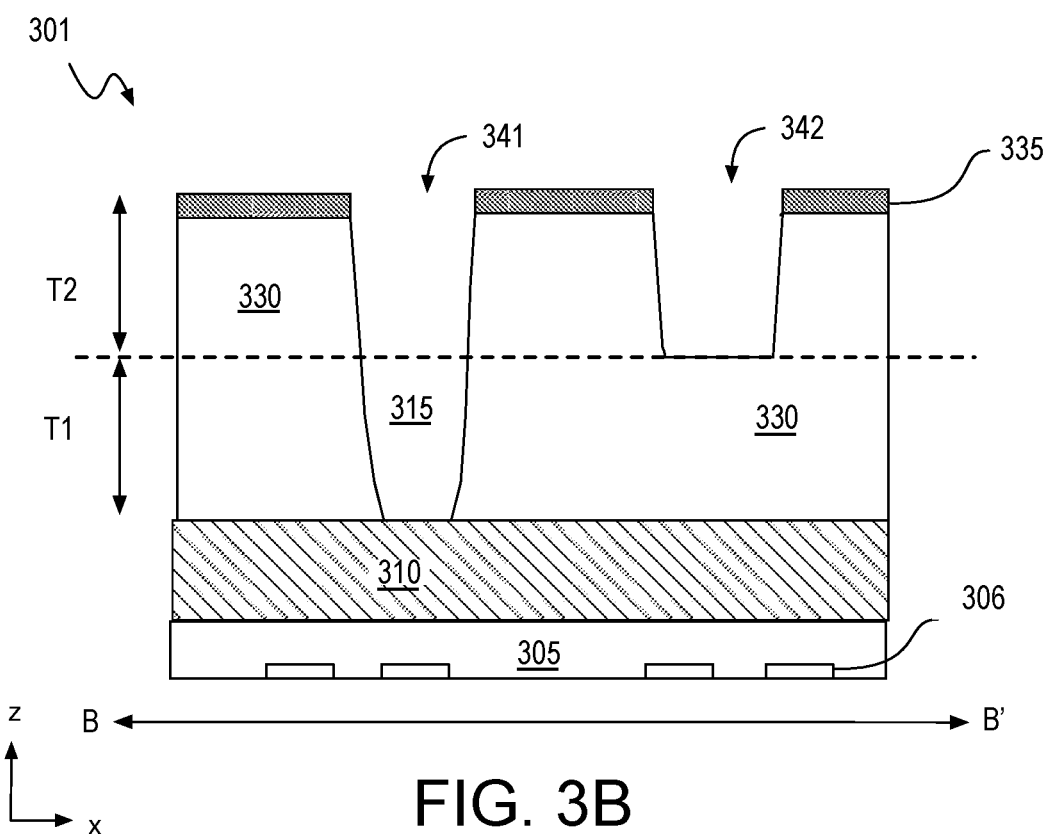
FIGS. 3B, 4B, 5B and 6B illustrate a cross-sectional view of a portion of an IC interconnect structure evolving as the methods illustrated in FIG. 2 are practiced, in accordance with some dual-damascene embodiments.

Referring first to FIG. 3A and FIG. 3B, interconnect structure portion 301 includes a via opening 315 through a thickness T1 of one or more dielectric materials 330. Thickness T1 may vary with implementation, but in some exemplary embodiments is 10 nm-50 nm. An underlying metallization feature (e.g., a line) 310 is exposed at a bottom of via opening 315. Metallization feature 310 is in a lower interconnect level below dielectric materials 330. Metallization feature 310 may have any composition, with some examples including copper, tungsten, titanium, cobalt, ruthenium, manganese, or aluminum. In FIG. 3A, portions of metallization feature 310 outlined in dashed line are below the surface.

Interconnect structure portion 301 further includes trench 341 over via opening 315, within a thickness T2 of dielectric materials 330. Thickness T2 may vary with implementation, but in some exemplary embodiments is 10-50 nm, or more. Another trench 342 laterally spaced apart from trench 341 is further illustrated, and the cross-section of trench 342 shown in FIG. 3B is representative of a cross-section of trench 341 out of the plane of the FIG. 3B where there is no via opening 315. As shown in FIG. 3A, trench 341 has a longitudinal length $L_1$ and a transverse width $W_1$. In exemplary embodiments, longitudinal length $L_1$ is significantly (e.g., 3×) larger than transverse width $W_1$. Although not illustrated, trench 341 has ends somewhere beyond the perimeter of interconnect structure portion 301. Trench 342 is substantially parallel to trench 341, but with a shorter longitudinal length $L_2$ to further illustrate a trench end. An etch stop material layer 335 is over dielectric materials 330, surrounding trenches 341, 342. Via opening 315 has a maximum lateral diameter $D_0$, which may vary with implementation, but is generally significantly smaller than the length of a trench (e.g., diameter $D_0$ is significantly smaller than longitudinal lengths $L_1$ and $L_2$).

Any single-step or multi-step anisotropic reactive ion etch (RIE) process (e.g., based on a $C_xF_y$ plasma chemistry) may have been practiced to form trenches 341, 342 and via opening 315, as embodiments are not limited in this respect. Trenches 341, 342 and via opening 315 are depicted with a tapered sidewall and positive slope such that a top width of via opening 315 is slightly larger than the bottom width. While such tapered slope is representative of subtractively patterned dielectrics, other profiles are possible as a function of the dielectric etch process.

Dielectric materials 330 may include any dielectric material suitable for electrical isolation of integrated circuitry. Dielectric materials 330, may, for example, be low-k dielectric materials (e.g., SiOC) having a relative permittivity below 3.4. In other examples, dielectric materials 330 may be any of SiO, SiON, hydrogen silsesquioxane, methyl silsesquioxane, polyimide, polynorbornenes, benzocyclobutene, or the like. Dielectric materials 330 may be deposited as a flowable oxide, for example, and have a substantially planar top surface. Etch stop material layer 335 may also be a dielectric material, but advantageously has a different composition than dielectric materials 330. Etch stop material layer 335 may have a somewhat higher relative permittivity than dielectric materials 330, for example. Etch stop material layer 335 may have any composition such as, but not limited to, SiN, SiO, SiON, $HfO_2$, ZrO, $Al_2O_3$, for example. Etch stop material layer 335 may have any thickness, but in some advantageous embodiments has a thickness less than 10 nm, and advantageously no more than 5 nm (e.g., 2-3 nm, etc.). In accordance with some further embodiments, dielectric materials 330 may further include an intervening trench etch stop material layer represented in FIG. 3B as a dashed line between dielectric material thicknesses T1 and T2.

As further shown in FIG. 3B, interconnect structure portion 301 is over a portion of an underlying substrate that includes a device layer 305. Within device layer 305 are a plurality of devices 306. In exemplary embodiments, devices 306 are metal-oxide-semiconductor field effect transistor (MOSFET) structures. However, devices 306 may also be other transistor types, such as, but not limited to other FET architectures, or bipolar junction transistors. Devices 306 may also be other devices that include one or more semiconductor junctions (e.g., diodes, etc.).

Figure 4A:
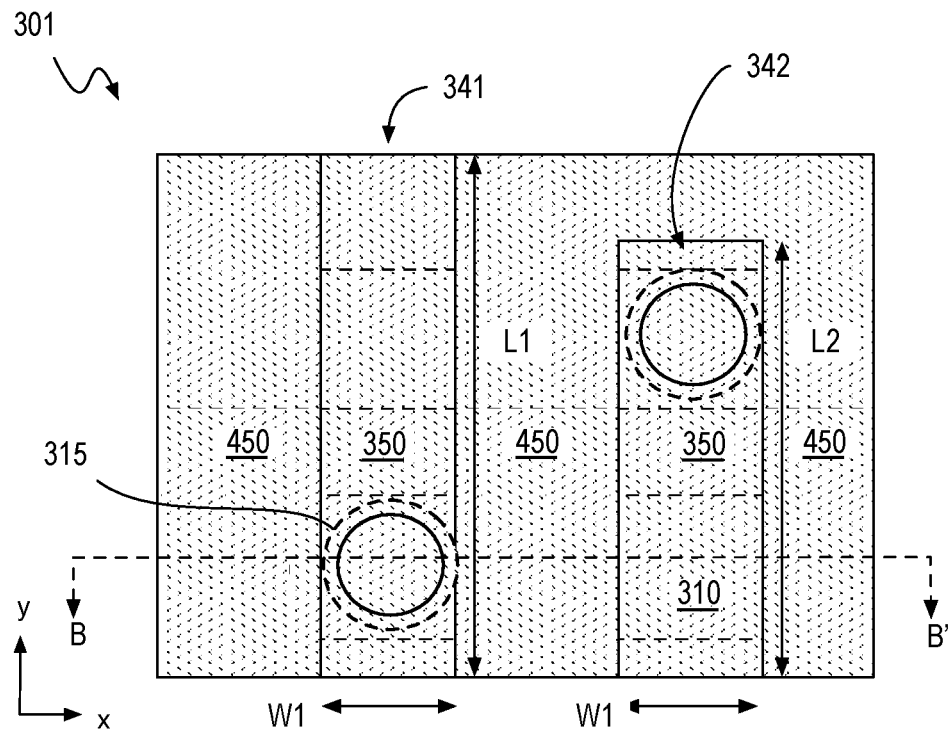
Figure 4B:
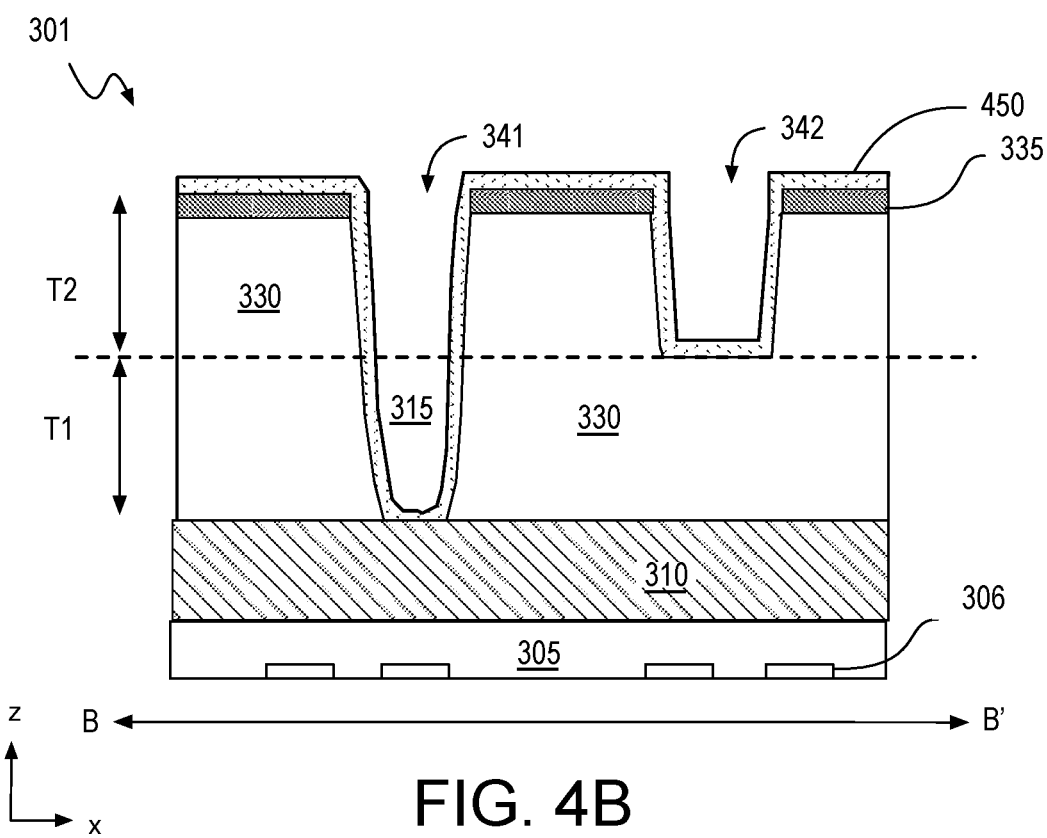

In the example further illustrated in FIG. 4A and FIG. 4B, a liner material 450 has been deposited over interconnect structure portion 301. In some embodiments, liner material 450 has a composition known to be suitable as a diffusion barrier. In some diffusion barrier examples, liner material 450 comprises a metal, such as, but not limited to, Ta, Mo, W, or Al. In some other embodiments, liner material 450 has a composition known to be suitable as an adhesion layer. In some adhesion layer examples, liner material 450 comprises a metal, such as, but not limited to, Ti, W or Pt. Liner material 450 may also comprise a metal compound that further includes at least one of Si, N, C, B, P or O. In some specific embodiments, liner material 450 further comprises nitrogen (e.g., TaN, WN, TiN, etc.). Liner material 450 may be substantially amorphous or may be polycrystalline.

Figure 5A:
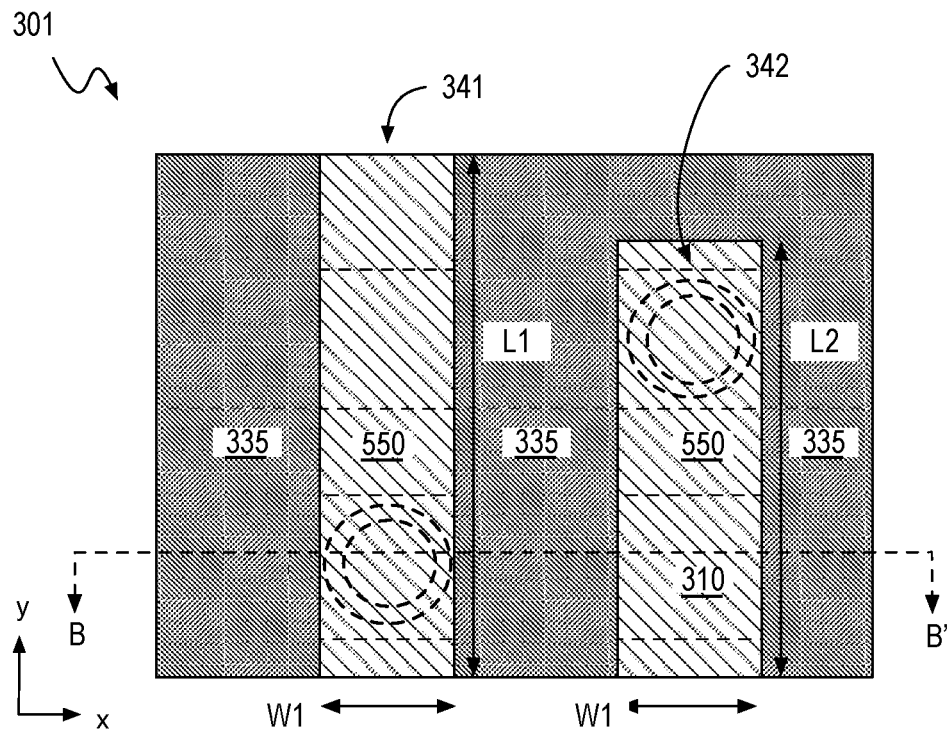
Figure 5B:
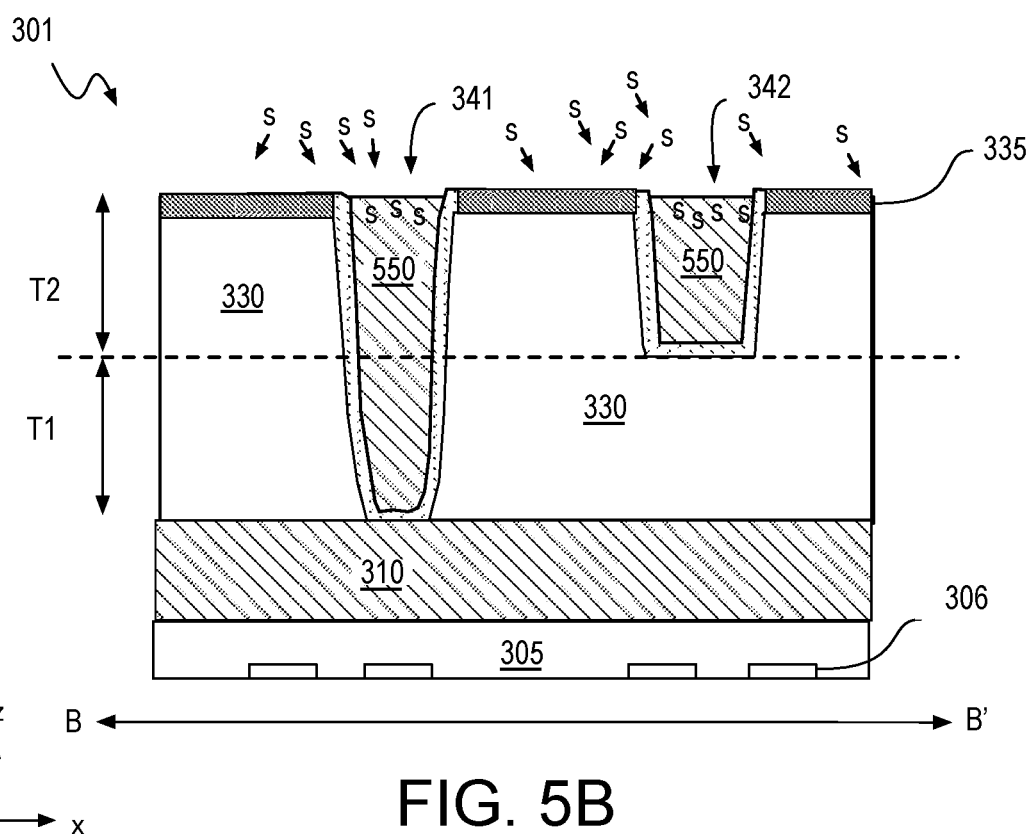

In the example further illustrated in FIG. 5A and FIG. 5B, one or more layers of interconnect bulk material 550 have been deposited into trenches 341, 342 and via opening 315. Bulk material 550 substantially backfills via opening 315 as well as trenches 341 and 342. In some exemplary embodiments, bulk material 550 comprises predominantly copper. In other embodiments, bulk material 550 comprises predominantly one of Mo, W, Ru, Re, Co, Ir, Rh, Pt, Pd, Al. As shown in FIG. 5B, bulk material 550, as well as liner material 450, is substantially planar with a top surface of the workpiece (e.g., etch stop material layer 335).

FIG. 5B further illustrates chalcogen doping of interconnect structure portion 301, for example according to the techniques described above in the context of operation 230 (FIG. 2). Although sulfur ("S") is shown, Se may also be introduced, for example in conjunction with S, or in the alternative to S. Likewise, tellurium may also be introduced.

Figure 6A:
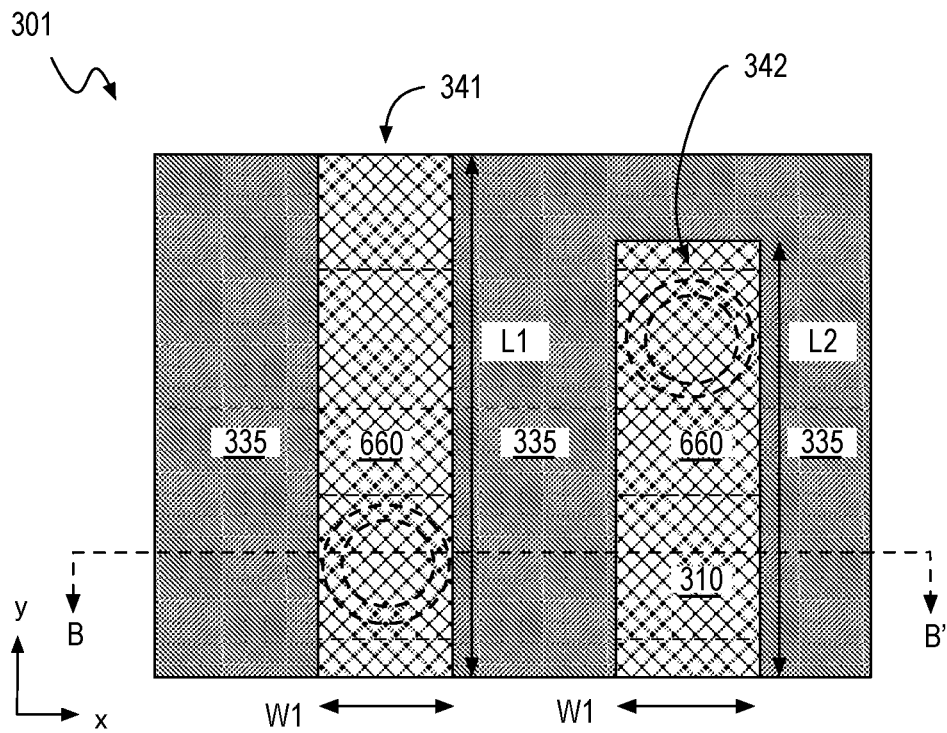
Figure 6B:
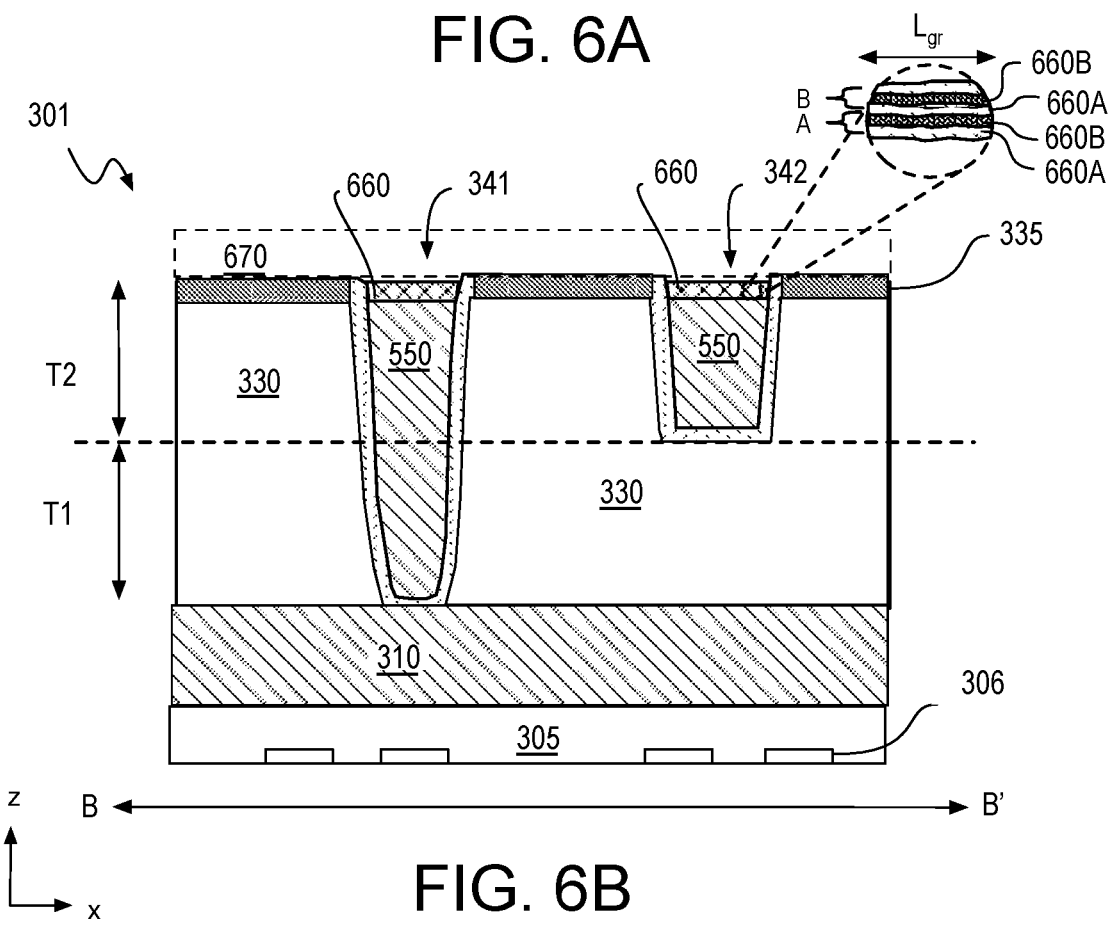

FIGS. 6A and 6B further illustrate interconnect structure portion 301 after the formation of upper-level interconnect layers 670, which may be fabricated after chalcogen doping and according to any techniques known to be suitable for integrated circuits. In FIG. 6B, upper-level interconnect layers 670 are depicted in dashed line to emphasize that upper-level interconnect layers 670 include at least one dielectric layer over the metallized trenches 341 and 342, but may also include any number of additional levels of interconnect metallization. In some embodiments, upper-level interconnect layers 670 include a dielectric material suitable as an interconnect diffusion barrier, such as a $SiN_x$, or $SiO_xN_y$, in direct contact with etch stop material layer 335.

As also shown in FIGS. 6A and 6B, following the practice of operation 230 (FIG. 2) interconnect structure portion 301 includes a metal chalcogenide ($MC_x$) cap 660 in direct contact with bulk material 550. Although metal chalcogenide cap 660 (FIG. 6B) may be a dichalcogenide ($MC_2$) in some instances, the cap 660 need not be a dichalcogenide because several oxidation states are possible such that x may vary, for example between about 0.2 and 4 in the metal chalcogenide compound $MC_x$. Consistent with metal dichalcogenides, cap 660 may have crystalline microstructure within a 2D plane of its monolayer(s), and low electron surface scattering qualities of the metal chalcogenide cap 660 may be attributable, at least in part, to this crystalline microstructure. One or more analysis techniques, such a transmission electron microscopy (TEM) coupled with XPS, EDX, or Raman spectroscopy may be employed to identify the presence of particular metal(s) and chalcogen(s) within metal chalcogenide cap 660, as well as quantify the crystal structure metal chalcogenide cap 660 (e.g., from Raman peak widths).

Although metal chalcogenide cap 660 is not limited to a single monolayer, in accordance with some exemplary embodiments metal chalcogenide cap 660 has a thickness less than 8 nm. Cap 660 may be advantageously less than 6 nm (e.g., 2-5 nm) to minimize interconnect resistance attributable to the cap, for example wherever an overlying via (not depicted) intersects the metal chalcogenide cap 660. Metal chalcogenide cap 660 may therefore advantageously have a thickness of two to six monolayers. In the expand view included as an inset of FIG. 6, two $MC_2$ monolayers A and B are illustrated. This depiction is representative of a high-resolution TEM of metal chalcogenide cap 660 following thermal anneal of a M:C region comprising sufficient chalcogen dopant concentration to form crystalline monolayers A and B, each comprising chalcogen atomic layer 660B between two metal atomic layers 660A. Hence, for embodiments where bulk material 550 is Cu doped with S, after a thermal anneal metal atomic layers 660A are substantially Cu and chalcogen atomic layer 660B is substantially S.

The stacked monolayer crystalline structure illustrated in the expanded view extends laterally within an x-y plane substantially parallel to an x-y plane of the interconnect line within interconnect structure portion 301. Each monolayer is continuous over the length of a grain. At a grain boundary, vertical (e.g., z-dimension) alignment of monolayers within two adjacent grains may be offset. For some treatments, the inventors found an average lateral grain length $L_{gr}$ to be at least 1 μm. Hence, grain length $L_{gr}$ is many orders of magnitude (e.g., 1000×) greater than the vertical thickness of each monolayer. Although not bound by theory, the large grain length $L_{gr}$ is currently thought to contribute to a marked reduction in interconnect line resistivity, which the inventors further found to exceed line resistivity reductions associated with graphitic caps having smaller average grain length (e.g., <10 nm).

As further illustrated in FIG. 6B, the chalcogenation of a top portion of bulk material 550 incurs a negligible interconnect line volume penalty because a top portion of bulk material 550 is converted into metal chalcogenide cap 660 as opposed to metal chalcogenide cap 660 being a discrete cap material deposited upon bulk material 550 as an overlay on the interconnect line. Hence, metal chalcogenide cap 660 occupies volume within the thickness T2 and the capped interconnect line remains substantially co-planar with etch stop material layer 335.

Although FIGS. 6A and 6B only illustrate one level of interconnect metallization comprising a line metallization and via metallization, interconnect structure portion 301 may be augmented to have any number of such levels of interconnect metallization according to the demands of a particular IC.

FIGS. 7A, 8A, 9A and 10A illustrate a plan view of a portion of an IC interconnect structure portion 701 evolving as methods 201 are practiced, in accordance with some single-damascene embodiments. FIGS. 7B, 8B, 9B and 10B further illustrate a cross-sectional view of a portion of an IC interconnect structure portion 701, in accordance with some single-damascene embodiments. Reference numbers are retained where one or more of the attributes introduced above in the context of interconnect structure portion 301 are also applicable to interconnect structure portion 701.

Figure 7A:
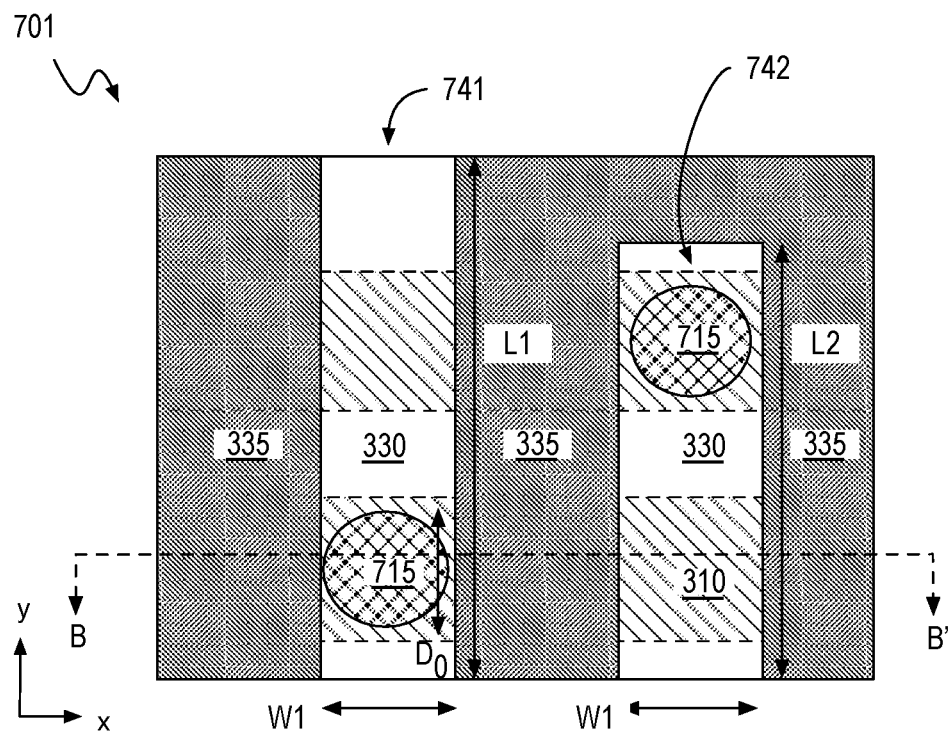
FIGS. 7A, 8A, 9A, and 10A illustrate a plan view of a portion of an IC interconnect structure evolving as the methods illustrated in FIG. 2 are practiced, in accordance with some single-damascene embodiments.
Figure 7B:
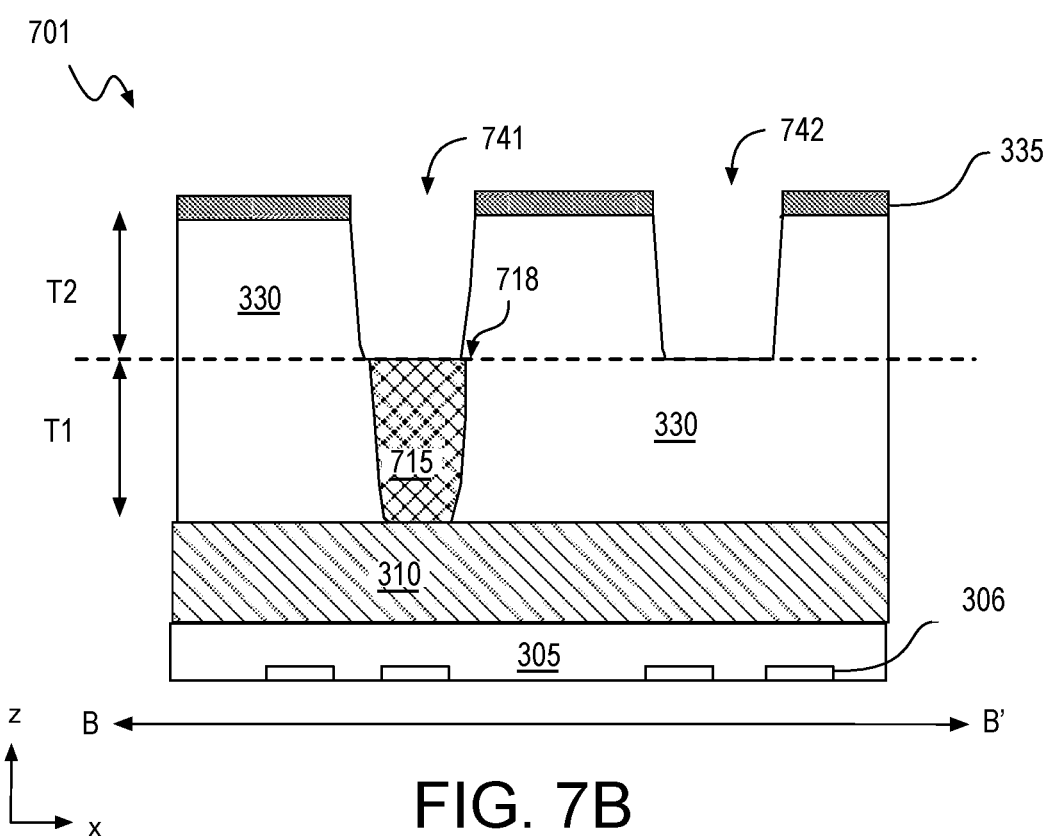
FIGS. 7B, 8B, 9B, and 10B illustrate a cross-sectional view of a portion of an IC interconnect structure evolving as the methods illustrated in FIG. 2 are practiced, in accordance with some single-damascene embodiments.

Referring first to FIG. 7A and FIG. 7B, interconnect structure portion 701 includes an electrically conductive via 715 extending through thickness T1 of one or more dielectric materials 330. Conductive via 715 comprises a bulk material that is electrically coupled to underlying metallization feature 310. Conductive via 715 may have been fabricated according to a first single-damascene process, for example. In this example, conductive via 715 has no liner, and may comprise any bulk material suitable for a linerless via, such as, but not limited to, tungsten, molybdenum, titanium, cobalt, or ruthenium. A top surface of conductive via 715 is exposed at a bottom of trench 741 patterned into dielectric materials 330. Separate patterning of conductive via 715 and trench 741 results in a non-zero lateral offset or profile discontinuity 718 at the interface of the sidewall of trench 741 and a sidewall of conductive via 715. Etch stop material layer 335 is again over dielectric materials 330, surrounding trenches 741, 742. As further shown in FIG. 7B, interconnect structure portion 701 is over a portion of an underlying substrate that includes a device layer 305. Within device layer 305 are a plurality of devices 306.

Figure 8A:
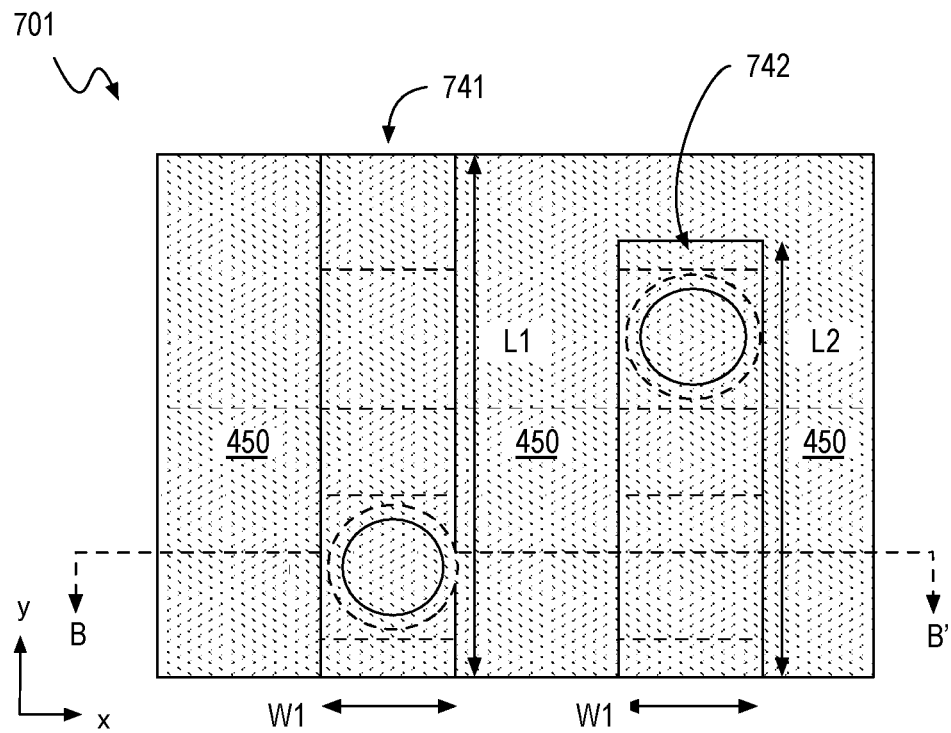
Figure 8B:
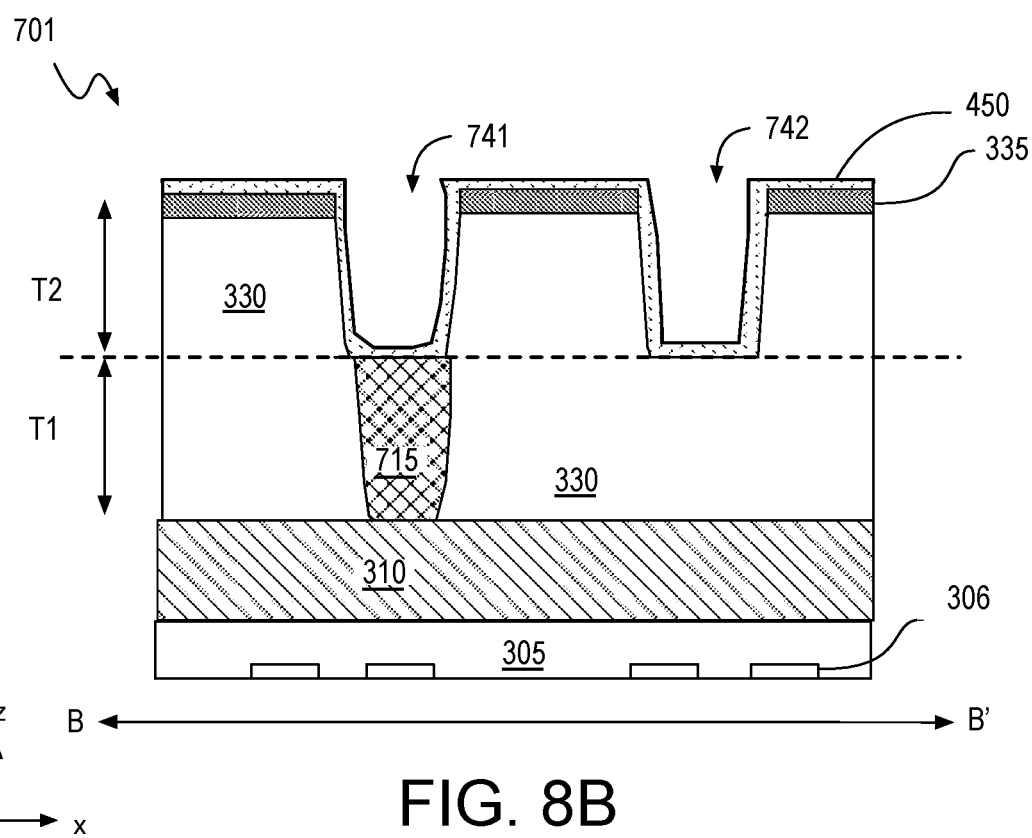
Figure 9A:
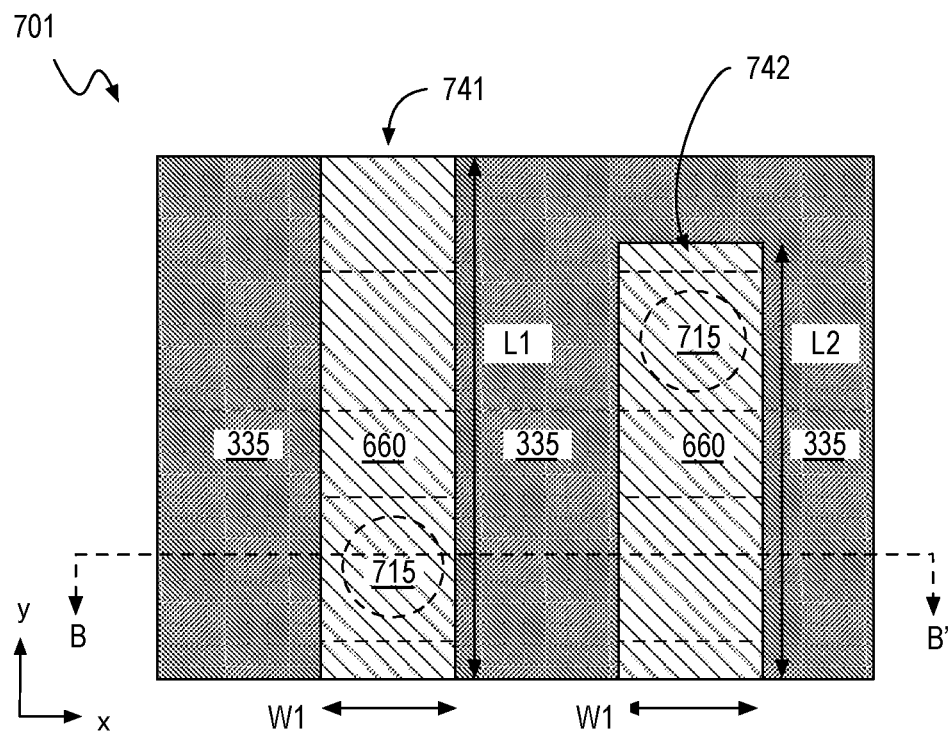
Figure 9B:
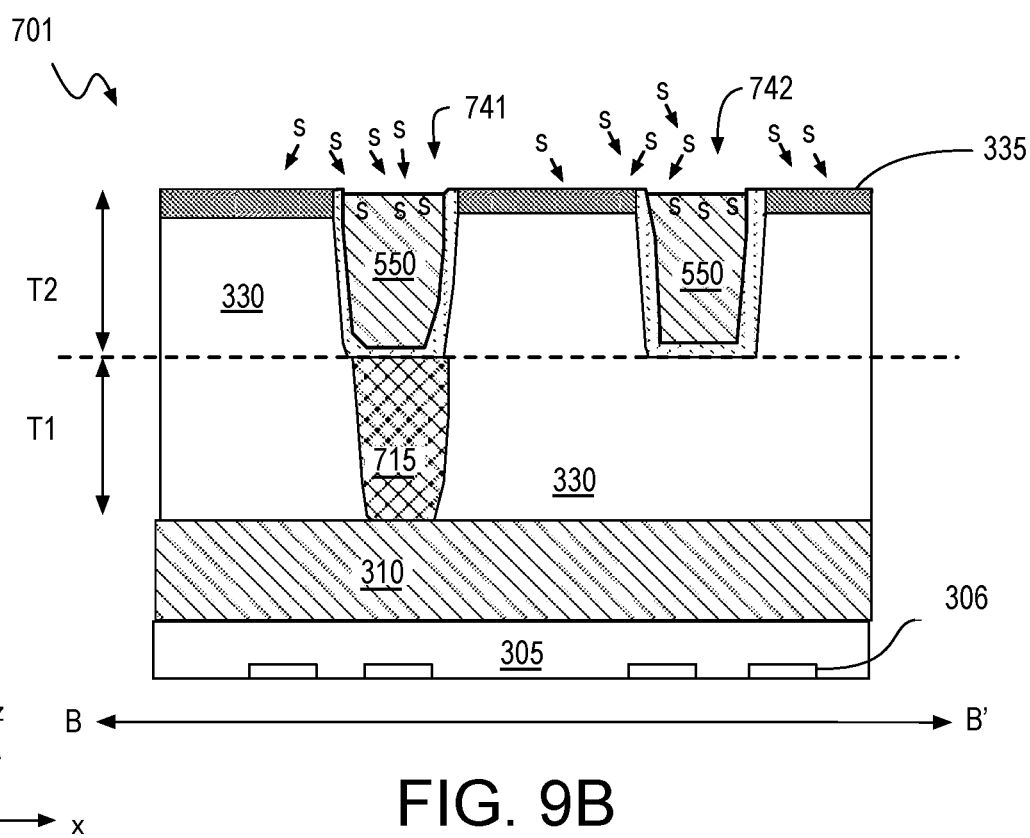
Figure 10A:
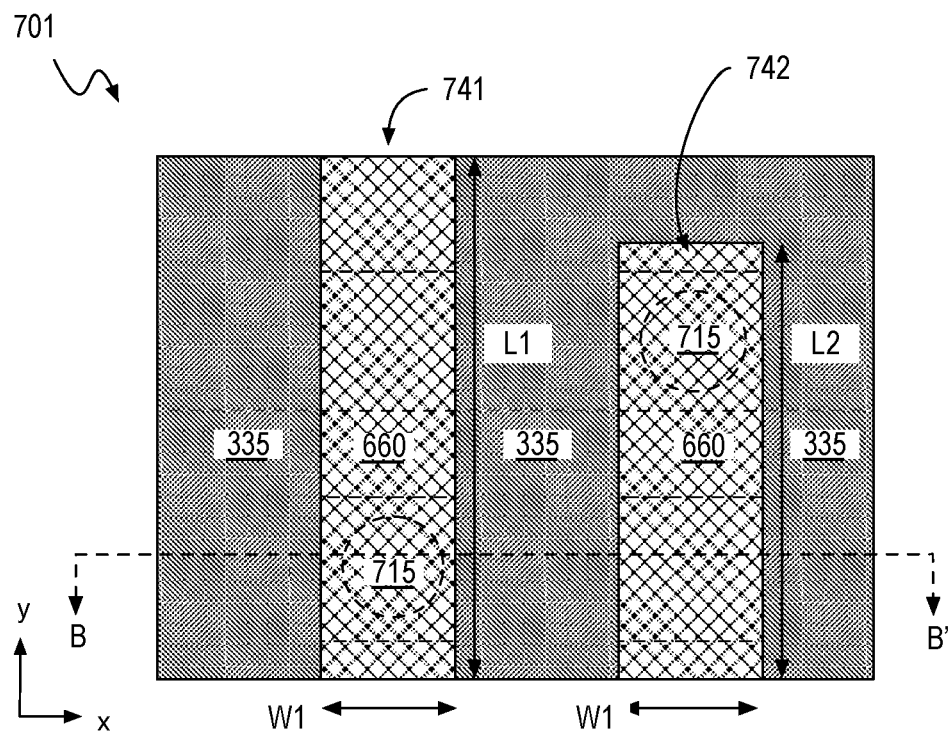
Figure 10B:
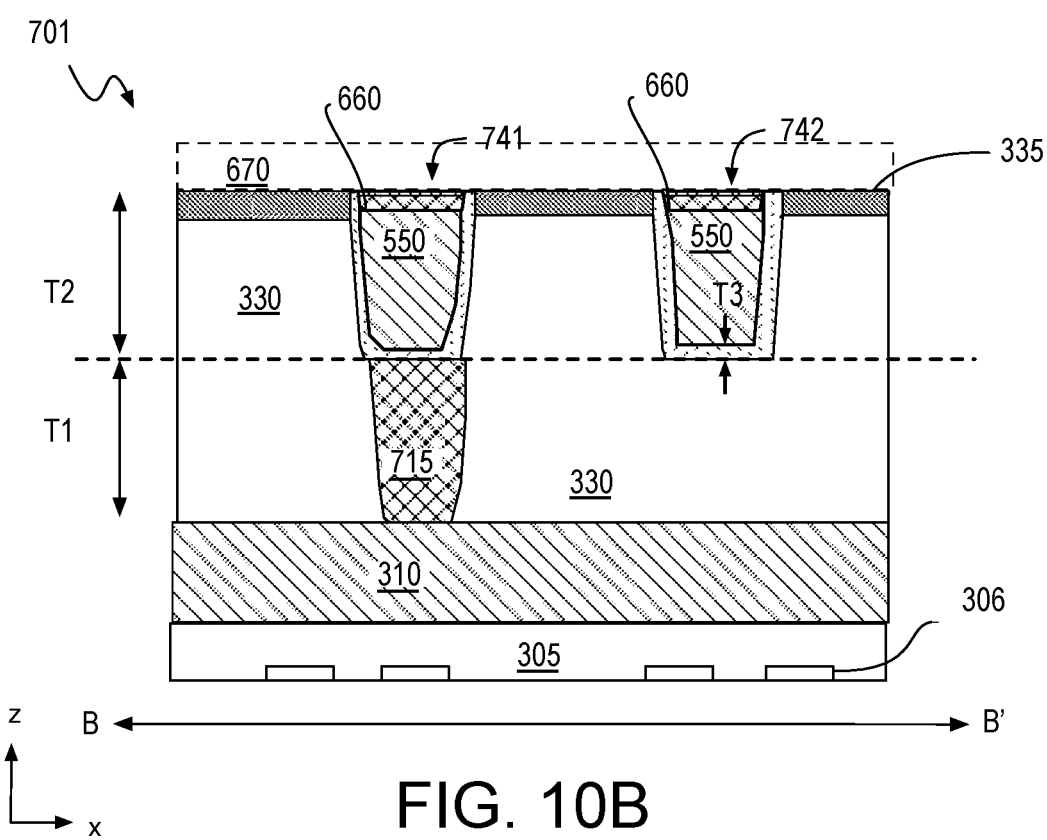

In the single-damascene example further illustrated in FIG. 8A and FIG. 8B, liner material 450 is within trenches 741, 742 and in contact with conductive via 715. Liner material 450 again has a thickness sufficient to function as at least one of an adhesion material layer or a diffusion barrier material layer. As shown in FIG. 9A and FIG. 9B, bulk material 550 substantially backfills trenches 741 and 742. Bulk material 550 is substantially planar with a top surface of the workpiece (e.g., etch stop material layer 335). Interconnect structure portion 701 is therefore a single damascene structure associated with one level of interconnect metallization comprising line metallization and via metallization. Interconnect structure portion 701 may be augmented to have any number of such levels of interconnect metallization as needed for a particular IC. FIG. 9B further illustrates chalcogen (e.g., S) doping of a top portion of bulk material 550, for example substantially as described above. FIGS. 10A and 10B illustrate a single-damascene embodiment of interconnect lines including a metal chalcogenide cap 660, which may be formed substantially as described above to have one or more of the physical properties described above.

Interconnect structure portions 301 and 701 may each be incorporated into any IC circuitry as a portion of any IC chip or die that may be singulated from a workpiece following the completion of any conventional processing. With a metal chalcogenide cap in accordance with embodiments herein, interconnect line metallization resistance may be reduced. IC circuitry may therefore display a lower RC delay and higher overall performance. An IC may also display lower power consumption and lower temperatures for a given level of performance.

Figure 11:
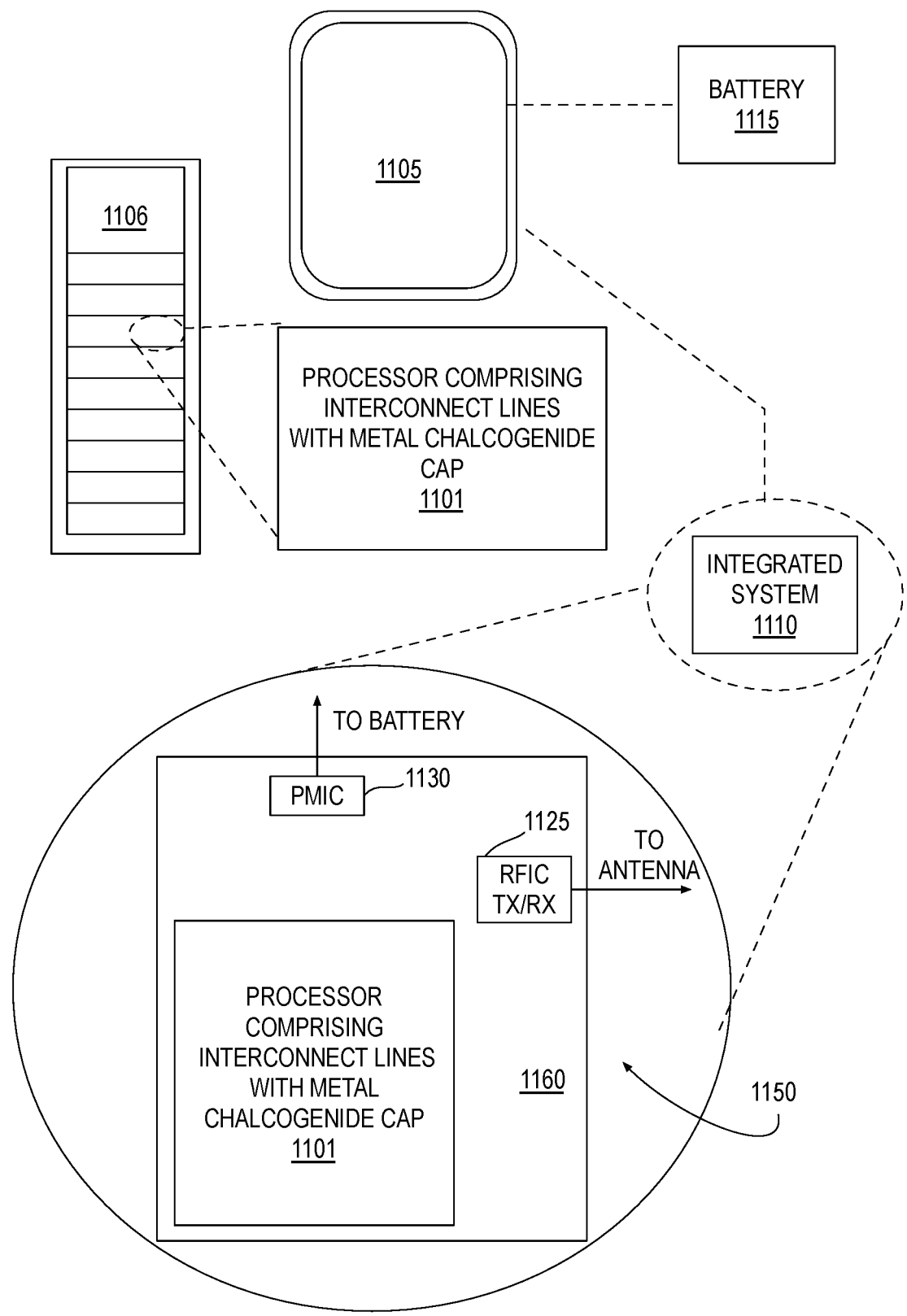
FIG. 11 illustrates a mobile computing platform and a data server machine employing an IC including an interconnect structure with a low resistance line comprising a metal chalcogenide cap, in accordance with some embodiments.

FIG. 11 illustrates a mobile computing platform 1105 and a data server computing platform 1106 employing an IC including interconnect structures with low resistance interconnect lines, for example including a metal chalcogenide cap substantially as described elsewhere herein. The server platform 1106 may be any commercial server, for example including any number of high-performance computing platforms disposed within a rack and networked together for electronic data processing, which in the exemplary embodiment includes a microprocessor 1101 including interconnect structures with low resistance interconnect lines, for example including a metal chalcogenide cap substantially as described elsewhere herein.

The mobile computing platform 1105 may be any portable device configured for each of electronic data display, electronic data processing, wireless electronic data transmission, or the like. For example, the mobile computing platform 1105 may be any of a tablet, a smart phone, laptop computer, etc., and may include a display screen (e.g., a capacitive, inductive, resistive, or optical touchscreen), a chip-level or package-level integrated system 1110, and a battery 1115. At least one IC of chip-level or package-level integrated system 1110 includes interconnect lines with a metal chalcogenide cap, for example substantially as described elsewhere herein.

In the example shown in expanded view 1150, integrated system 1110 includes microprocessor 1101 that includes interconnect lines with a metal chalcogenide cap, for example substantially as described elsewhere herein. Microprocessor 1101 may be further coupled to a host substrate 1160. One or more of a power management integrated circuit (PMIC) 1130 or an RF (wireless) integrated circuit (RFIC) 1125 including a wideband RF (wireless) transmitter and/or receiver (TX/RX) may be further coupled to host substrate 1160.

Functionally, PMIC 1130 may perform battery power regulation, DC-to-DC conversion, etc., and so has an input coupled to battery 1115 and with an output providing a current supply to other functional modules (e.g., microprocessor 1101). As further illustrated, in the exemplary embodiment, RFIC 1125 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 4G, 5G, and beyond.

Figure 12:
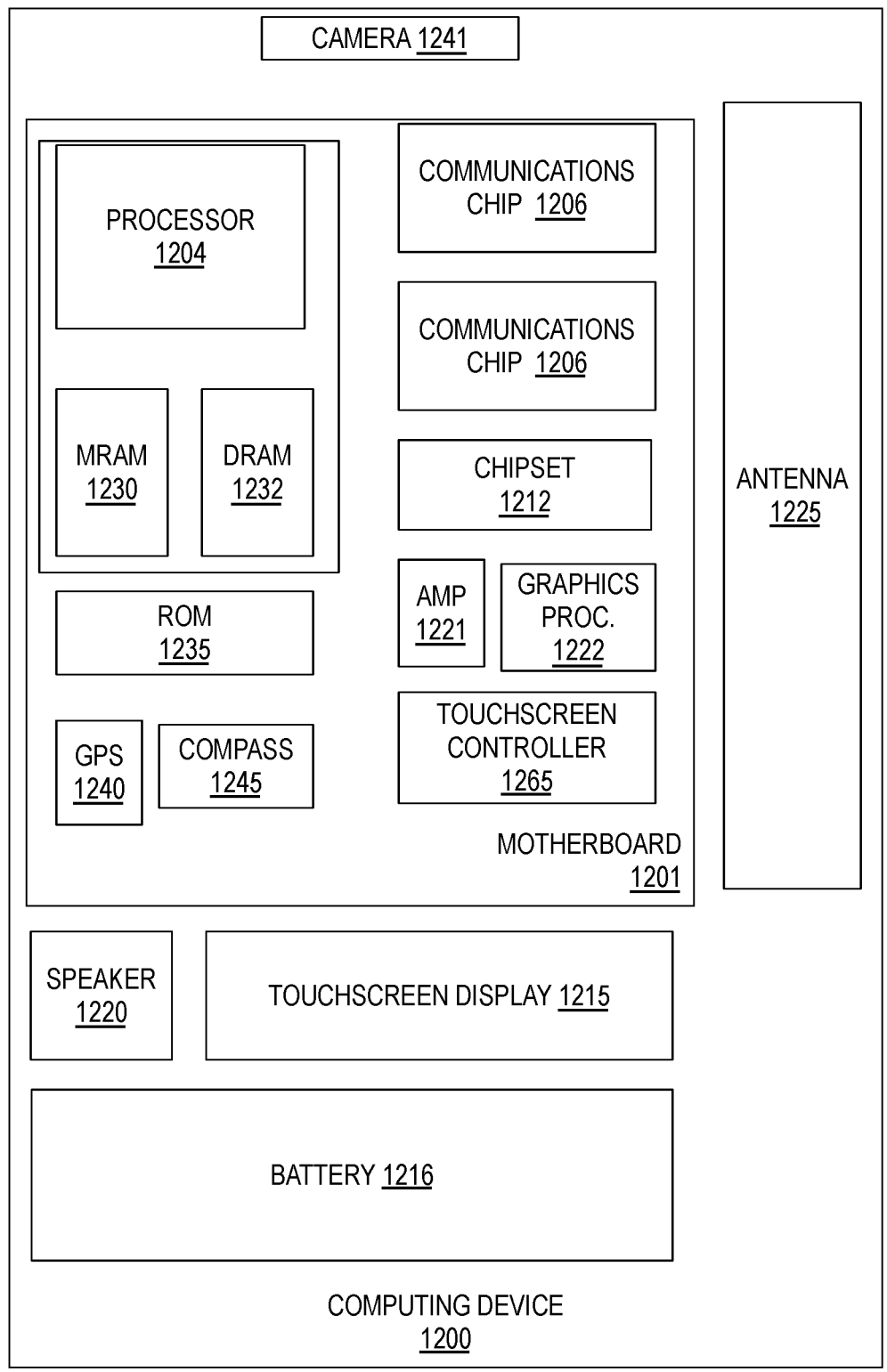
FIG. 12 is a functional block diagram of an electronic computing device, in accordance with some embodiments.

FIG. 12 is a functional block diagram of an electronic computing device 1200, in accordance with an embodiment of the present invention. Computing device 1200 may be found inside platform 1105 or server platform 1106, for example. Device 1200 further includes a motherboard 1201 hosting a number of components, such as, but not limited to, a processor 1204 (e.g., an applications processor). Processor 1204 may be physically and/or electrically coupled to motherboard 1201. In some examples, processor 1204 includes interconnect lines with a metal chalcogenide cap, for example substantially as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1206 may also be physically and/or electrically coupled to the motherboard 1201. In further implementations, communication chips 1206 may be part of processor 1204. Depending on its applications, computing device 1200 may include other components that may or may not be physically and electrically coupled to motherboard 1201. These other components include, but are not limited to, volatile memory (e.g., DRAM 1232), non-volatile memory (e.g., ROM 1235), flash memory (e.g., NAND or NOR), magnetic memory (MRAM 1230), a graphics processor 1222, a digital signal processor, a crypto processor, a chipset 1212, an antenna 1225, touchscreen display 1215, touchscreen controller 1265, battery 1216, audio codec, video codec, power amplifier 1221, global positioning system (GPS) device 1240, compass 1245, accelerometer, gyroscope, speaker 1220, camera 1241, and mass storage device (such as hard disk drive, solid-state drive (SSD), compact disk (CD), digital versatile disk (DVD), and so forth), or the like. In some exemplary embodiments, at least one of the functional blocks noted above include interconnect structures with low via resistance, for example as described elsewhere herein.

Communication chips 1206 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1206 may implement any of a number of wireless standards or protocols, including but not limited to those described elsewhere herein. As discussed, computing device 1200 may include a plurality of communication chips 1206. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

It will be recognized that the invention is not limited to the embodiments so described, but can be practiced with modification and alteration without departing from the scope of the appended claims. For example, the above embodiments may include specific combinations of features as further provided below.

In first examples, an integrated circuit (IC) interconnect structure comprises a via metallization within a dielectric material, and a line metallization over, and coupled to, the via metallization. The line metallization comprises a bulk material comprising a metal, a liner material between a bottom of the bulk material and the dielectric material, and a cap material over the bulk material, wherein the cap material comprises the metal and a chalcogen.

In second examples, for any of the first examples the chalcogen comprises S or Se In third examples, for any of the first through second examples the metal is Cu.

In fourth examples, for any of the first through third examples the cap material has a thickness less than 6 nm.

In fifth examples, for any of the first through fourth examples the cap material has a different crystallinity than the bulk material.

In sixth examples, for any of the fifth examples a monolayer of the cap material comprises a first atomic layer of predominantly the first metal in contact with a second atomic layer of predominantly the chalcogen.

In seventh examples, for any of the sixth examples the cap comprises the first atomic layer of predominantly the metal between two of the second atomic layers of predominantly the chalcogen.

In eighth examples, for any of the sixth through seventh examples the line metallization extends a lateral length within a plane of the IC interconnect structure and the first and second monolayers are substantially parallel to the plane.

In ninth examples for any of the sixth through eighth examples the first monolayer is continuous over a grain length, and wherein the grain length is at least 1 μm.

In tenth examples, for any of the first through ninth examples the IC interconnect structure further comprises a diffusion barrier over the cap, wherein the diffusion barrier comprises a second dielectric material.

In eleventh examples, for any of the tenth examples the second dielectric material comprises nitrogen and silicon.

In twelfth examples a computer platform comprises a power supply, and an integrated circuit (IC) coupled to the power supply. The IC comprises a device layer comprising a plurality of transistors comprising one or more semiconductor materials, and a plurality of interconnect levels. The interconnect levels further comprise a first line metallization, a dielectric material over the first line metallization, a via metallization through the dielectric material, and coupled to the first line metallization, and a second line metallization over, and coupled to, the first line metallization through the via metallization. The second line metallization comprises a bulk material comprising a metal, a liner material between a bottom of the bulk material and the dielectric material, and a cap material over the bulk material, wherein the cap material comprises the metal and a chalcogen.

In thirteenth examples, for any of the twelfth examples the IC comprises a microprocessor.

In fourteenth examples, for any of the twelfth through thirteenth examples the chalcogen comprises S or Se, the metal comprises Cu, the cap material has a thickness less than 6 nm. The cap material comprises a first atomic layer of predominantly the metal in contact with a second atomic layer of predominantly the chalcogen. The first monolayer is continuous over a grain length, and the grain length is at least 1 μm.

In fifteenth examples a method of fabricating an integrated circuit (IC) interconnect structure comprises forming a trench in a dielectric material, depositing a liner material on a surface of the dielectric material, depositing a bulk material within the trench, planarizing the bulk material with a surface of the dielectric material, and reacting a top portion of bulk material with a chalcogen.

In sixteenth examples, for any of the fifteenth examples reacting a top portion of the bulk material with the chalcogen further comprises doping at least the top portion of the bulk material with the chalcogen, and converting the top portion of the bulk material into a metal chalcogenide having different crystallinity than the bulk material by heating the IC interconnect structure.

In seventeenth examples, for any of the sixteenth examples the method further comprises depositing a dielectric material over the bulk material after doping the bulk material with the chalcogen and prior to heating the IC interconnect structure.

In eighteenth examples, for any of the sixteenth through seventeenth examples the chalcogen comprises S, and doping the bulk material with the chalcogen comprises exposing a top surface of the bulk material to a source gas comprising $H_2S$.

In nineteenth examples, for any of the eighteenth examples depositing a bulk material comprises plating Cu, and converting the top portion of the bulk material into the metal chalcogenide further comprises forming a cap material comprising Cu and S over the bulk material.

In twentieth examples, for any of the sixteenth through nineteenth examples heating the IC interconnect structure comprises a furnace anneal at less than 350° C.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. An integrated circuit (IC) interconnect structure, comprising:
   a via metallization within a dielectric material; and
   a line metallization over, and coupled to, the via metallization, wherein the line metallization comprises:
      a bulk material comprising a first metal;
      a liner material between a bottom of the bulk material and the dielectric material and adjacent to a sidewall of the bulk material, the liner material comprising a second metal; and
      a cap material over the bulk material, but not over the liner material adjacent to the sidewall of the bulk material, wherein the cap material comprises a first atomic layer of predominantly the first metal in contact with a second atomic layer of predominantly a chalcogen.

2. The IC interconnect structure of claim 1, wherein the chalcogen comprises S or Se.

3. The IC interconnect structure of claim 2, wherein the first metal is Cu, and the second metal is Ta, Mo, W, Al, Ti, W or Pt.

4. The IC interconnect structure of claim 1, wherein the cap material has a thickness less than 6 nm and where a top surface of the cap material is substantially co-planar with a top surface of at least one of the liner or a dielectric material adjacent to the liner.

5. The IC interconnect structure of claim 1, wherein the cap comprises the first atomic layer of predominantly the metal between two of the second atomic layers of predominantly the chalcogen.

6. The IC interconnect structure of claim 1, wherein the line metallization extends a lateral length within a plane of the IC interconnect structure and the first and second atomic layers are parallel to the plane.

7. The IC interconnect structure of claim 1, wherein the first atomic layer is continuous over a grain length, and wherein the grain length is at least 1 μm.

8. The IC interconnect structure of claim 1, further comprising a diffusion barrier over the cap, wherein the diffusion barrier comprises a second dielectric material.

9. The IC interconnect structure of claim 8, wherein the second dielectric material comprises nitrogen and silicon.

10. A computer platform comprising:
    a power supply; and
    an integrated circuit (IC) coupled to the power supply, wherein the IC comprises:

a device layer comprising a plurality of transistors comprising one or more semiconductor materials; and a plurality of interconnect levels, the interconnect levels further comprising the IC interconnect structure of claim 1.

11. The computer platform of claim 10, wherein the IC comprises a microprocessor.

12. The computer platform of claim 10, wherein:

the chalcogen comprises S or Se;

the first metal is Cu or Mo;

the cap material has a thickness less than 6 nm;

the cap material comprises a first atomic layer of predominantly the Cu or Mo in contact with a second atomic layer of predominantly the S or Se;

the first atomic layer is continuous over a grain length of the cap material; and the grain length is at least 1 µm.

\* \* \* \* \*